United States Patent [19]

Inoue

[11] Patent Number: 5,229,965

[45] Date of Patent: Jul. 20, 1993

[54] SERIAL ACCESSIBLE SEMICONDUCTOR MEMORY DEVICE

[75] Inventor: Kazunari Inoue, Hyogo, Japan

[73] Assignee: Mitsubishi Denki Kabushiki Kaisha, Tokyo, Japan

[21] Appl. No.: 754,897

[22] Filed: Sep. 4, 1991

[30] Foreign Application Priority Data

Sep. 12, 1990 [JP] Japan .................................. 2-243007

[51] Int. Cl.$^5$ ............................................. G11C 13/00
[52] U.S. Cl. ........................... 365/189.04; 365/189.05; 365/230.05; 365/230.08; 365/233
[58] Field of Search ....................... 365/189.04, 189.01, 365/189.09, 189.05, 230.01, 230.05, 233, 230.08

[56] References Cited

U.S. PATENT DOCUMENTS 5,138,579  8/1992  Tatsumi et al. ................. 365/189.09

*Primary Examiner*—Terrell W. Fears
*Attorney, Agent, or Firm*—Lowe, Price, LeBlanc & Becker

[57] ABSTRACT

The semiconductor memory device includes a serial memory cell array and an input-output circuit. The input-output circuit includes first and second latch circuits, first and second transfer circuits and an output circuit. The first transfer circuit transfers the information read from the serial memory cell array to the first latch circuit. The second transfer circuit transfers the information from the first latch circuit 103 to the second latch circuit 105. The output circuit externally supplies as output the information held in the second latch circuit. A clock generator supplies a clock signal to the first and the second transfer circuits and the output circuit so that the output operation by the output circuit may be effected, and then the transfer operation by the first transfer circuit may be effected after the transfer by the second transfer circuit has been effected.

11 Claims, 6 Drawing Sheets

SERIAL ACCESSIBLE SEMICONDUCTOR MEMORY DEVICE

BACKGROUND OF THE INVENTION

1. Field of the Invention

The invention relates generally to semiconductor memory devices and, more particularly, relates to a semiconductor memory device in which data is serially read and an operating method thereof.

2. Description of the Background Art

FIG. 4 is a block diagram showing one example of the configuration of a dual port memory. The dual port memory includes a random accessible memory cell array arranged in a matrix and a serial accessible serial memory cell array, and has been often used recently, for example, as a memory for video processing.

In FIG. 4, each of four memory cell arrays 1a, 1b, 1c, 1d includes a plurality of memory cells arranged in a matrix having a plurality of rows and a plurality of columns. External address signals A0–An are applied to an address buffer 2. A row decoder 3 receives an address signal from the address buffer 2 and selects one row in each of the memory cell arrays 1a, 1b, 1c, 1d. A column decoder 4 receives an address signal from the address buffer 2 and selects one column in each of the memory cell arrays 1a, 1b, 1c, 1d. The data in the four memory cells selected by the row decoder 3 and the column decoder 4 is respectively supplied to data input-output terminals r1–r4 through an I/O switch circuit 5 and an input/output circuit 6. Data D0–D3 of 4 bits supplied to the data input-output terminals r1–r4 is supplied to a memory cell selected by the row decoder 3 and the column decoder 4 through the input-output circuit 6 and the I/O switch circuit 5.

Each of serial memory cell arrays 8a, 8b, 8c, 8d includes a plurality of memory cells arranged in one row. Data of one row is transferred by a transfer circuit 7 between each of the serial memory cell arrays 8a–8d and each of the memory cell arrays 1a–1d. A serial selector 9 receives an address signal from the address buffer 2 and indicates a start address in each of the serial memory cell arrays 8a–8d. Then, an external clock signal SC supplied to an input terminal 14 is converted into an internal signal iSC in a clock generator 13. The serial selector 9 sequentially selects one bit in each of the serial memory cell arrays 8a–8d in response to the internal signal iSC. An I/O switch circuit 10 and an input-output circuit 11 transfer serial input-output data SD0–SD3 between the serial memory cell arrays 8a–8d and the data input-output terminals s1–s4.

A timing generator 12 generates each kind of timing signals for controlling the operation of each portion in response to an externally applied row address strobe signal $\overline{RAS}$, a column address strobe signal $\overline{CAS}$, a data transfer/output enable signal $\overline{DT/OE}$ and a write per bit/write enable signal $\overline{WB/WE}$. The clock generator 13 generates an internal clock signal iSC and transfer signals $\phi 1$, $\overline{\phi 1}$, $\phi 2$, $\overline{\phi 2}$ in response to the external clock signal SC.

FIG. 5 is a circuit diagram showing the structure of the main portion of the dual port memory in FIG. 4.

A plurality of bit line pairs BL, $\overline{BL}$ are arranged in the memory cell array 1a. A plurality of word lines WL are arranged to cross those bit line pairs BL, $\overline{BL}$. A memory cell MC is provided at a cross-over point of a word line WL and a bit line BL or a bit line $\overline{BL}$. The plurality of word lines WL are connected to a row decoder 3. A sense amplifier SA is connected to each bit line pair BL, $\overline{BL}$. Each sense amplifier SA is connected to data input-output line pair DIO, $\overline{DIO}$ through N channel MOS transistors Q1, Q2. A column selecting signal is supplied to the gates of the transistors Q1, Q2 from a column decoder 4. The transistors Q1, Q2 and the data input-output line pair DIO, $\overline{DIO}$ constitute an I/O switch circuit 5.

A static type memory cell SMC including inverters G1, G2 is connected to each bit line pair BL, $\overline{BL}$ through N channel MOS transistors Q3, Q4. A data transfer signal DT is applied to the gates of the transistors Q3, Q4. A plurality of pairs of transistors Q3, Q4 constitute a transfer circuit 7. A plurality of memory cells SMC constitute a serial memory cell array 8a.

Each memory cell SMC is connected to a data input-output line pair SIO, $\overline{SIO}$ through N channel MOS transistors Q5, Q6. A selecting signal is applied to the gates of the transistors Q5, Q6 from a serial selector 9. A plurality of pairs of transistors Q5, Q6 and the data input-output line pair SIO, $\overline{SIO}$ constitute an I/O switch circuit 10.

The read operation of the memory cell array 1a is described. Any one of the plurality of word lines WL is selected by the row decoder 3. Data is read to respectively corresponding bit line pair BL, $\overline{BL}$ from the plurality of memory cells MC connected to the selected word line WL. The data read into each bit line pair BL, $\overline{BL}$ is amplified by the sense amplifier SA. Any one pair of the plurality of pairs of transistors Q1, Q2 is selected by the column decoder 4. As a result, the selected pair of transistors Q1, Q2 turn on, so that the data read into the corresponding bit line pair BL, $\overline{BL}$ is transferred to the data input-output line pair DIO, $\overline{DIO}$.

The read operation of the serial memory cell array 8a will now be described. One pair of the plurality of pairs of transistors Q5, Q6 is selected by the serial selector 9. The selected transistors Q5, Q6 turn on, so that the data stored in the corresponding memory cell SMC is transferred to the data input-output line pair SIO, $\overline{SIO}$. The serial selector 9 serially selects a plurality of pairs of transistors Q5, Q6 in response to an internal clock signal iSC supplied from the clock generator 13.

In the dual port memory of FIG. 4, picture information can be stored in the memory cell arrays 1a–1d from a CRT controller and so on through the data input-output terminals r1–r4. The picture information stored in the memory cell arrays 1a–1d is transferred to the serial memory cell arrays 8a–8d by the serial transfer circuit 7. The picture information transferred to the serial memory cell arrays 8a–8d is serially, and externally supplied through the data input-output terminals s1–s4.

As the serial memory cell arrays 8a–8d can operate in an access time and a cycle time of about 30 nsec, data can be obtained at higher speed compared with the memory cell arrays 1a–1d having an access time and a cycle time of about 200 nsec.

While writing of data in the memory cell arrays 1a–1d is being effected, data can be read asynchronously from the serial memory cell arrays 8a–8d. Therefore, data can be obtained without a read stop period and at high speed. They are therefore widely used as a memory for video processing.

FIG. 6 is a circuit diagram showing the structure of the input-output circuit 11 shown in FIG. 4.

The input-output circuit of FIG. 6 includes amplifiers 101, 107, a first transfer circuit 102, a second transfer circuit 104, a first latch circuit 103, a second latch circuit 105, an output circuit 106 and inverters G7, G8. The inverter G8 and the output circuit 106 constitute a main amplifier.

At the time of reading data, the amplifier 101 amplifies the data of the input-output line pair SIO, $\overline{SIO}$ at high speed. At the time of writing data, the amplifier 107 amplifies the data SDi supplied to the data input-output terminal si at high speed and applies the amplified data to the data input-output line pair SIO, $\overline{SIO}$, where i represents 0, 1, 2, 3.

The first transfer circuit 102 includes P channel MOS transistors Q11, Q12 and N channel MOS transistors Q13, Q14. Transfer signals $\phi1$, $\overline{\phi1}$ are supplied to the gates of the transistors Q11, Q14, respectively. The transfer signals $\phi1$ and $\overline{\phi1}$ are complementary to each other. The first latch circuit 103 includes inverters G3, G4. The second transfer circuit 104 includes P channel MOS transistors Q15, Q16 and N channel MOS transistors Q17, Q18. Transfer signals $\overline{\phi2}$, $\phi2$ are supplied to the gates of the transistors Q15, Q18, respectively. The transfer signals $\phi2$, $\overline{\phi2}$ are complementary to each other. The second latch circuit 105 includes inverters G5, G6. The output circuit 106 includes N channel MOS transistors Q19, Q20.

The operation of reading data in the input-output circuit of FIG. 6 will now be described with reference to the waveform diagrams in FIGS. 7 and 8.

A description is made here of a case in which the data read from the n-th address of the serial memory cell arrays 8a–8d is externally supplied as output. The data read from the n-th address of the serial access memory is held in the first latch circuit 103. Referring to FIG. 7, when the external clock signal SC rises to an H level, at first, the transfer signal $\phi2$ rises to an H level. The second transfer circuit 104 turns on, and the data held in the first latch circuit 103 is transferred to the second latch circuit 105. As a result the data held in the second latch circuit 105 is amplified by the output circuit 106 and supplied to the data input-output terminal si.

The access time tSCA from the time the external clock signal SC rises to an H level to the time the data SDi is supplied to the data input-output terminal si is at most 5 to 10 nsec. The time (previous data hold time) tSOH from the time the external clock signal SC rises to an H level to the time the data which has been outputted in the previous cycle starts changing is at most 0–5 nsec.

The transfer signal $\phi2$ falls to an L level when a fixed period of time has passed after it attained an H level. After $\phi2$ has completely attained an L level, the transfer signal $\phi1$ rises to an H level. The first transfer circuit 102 turns on, and the data read from the (n+1)-th address in preparation for a read operation of the next cycle is transferred to the first latch circuit 103 through the data input-output line pair SIO, $\overline{SIO}$ and the amplifier 101.

In the next cycle, after the data held in the first latch circuit 103 is transferred to the second latch circuit 105, the data read from the (n+2)-th address is transferred to the first latch circuit 103. In this way, a look ahead system is employed. As a result, the access time tSCA becomes a sufficiently short value.

As stated above, while the access time tSCA becomes short enough in accordance with the conventional input-output circuit shown in FIG. 6, there is a problem that the previous data hold time tSOH becomes too short. The input-output circuit of FIG. 6 is a complete edge-triggered circuit. The data in the previous cycle changes and the data in the next cycle is outputted in response to the rising edge of the external clock signal SC from an L level to an H level.

In a practical system in which such a dual port memory is used, data is often inputted at a rising edge from an L level to an H level of the external clock signal SC. Therefore, the previous data hold time tSOH of 5–10 nsec must be ensured as a standard of the device.

However, when the previous data hold time tSOH is made longer, as shown in FIG. 8, the access time tSCA also becomes longer. The maximum value of the access time tSCA in the standard of the device is determined as 20–25 nsec. In this way, the time period from the time the external clock signal SC is supplied to the time the transfer signal $\phi2$ shown in FIGS. 7 and 8 rises to an H level involves a problem if it is too short or too long and must be in an extremely narrow range.

If the time period from the time the external clock signal SC is applied to the time the transfer signal $\phi2$ rises is delayed, an optimum previous data hold time tSOH and access time tSCA can be obtained. After the transfer signal $\phi2$ falls, however, a transfer signal $\phi1$ must be supplied in preparation for a read operation in the next cycle. When an external clock signal SC in the next cycle is supplied in the period from the time $\phi1$ rises to an H level to the time it falls to an L level, a malfunction is caused. That is, the time at which the transfer signal $\phi1$ falls is a limit of the minimum cycle time tSCC. The standard of the minimum value of the cycle time tSCC is about 30 nsec.

In this way, there is a problem that the minimum value of the cycle time tSCC becomes longer if the previous data hold time tSOH and the access time tSCA are made longer.

SUMMARY OF THE INVENTION

An object of the invention is to speed up the operation of a serial access memory.

Another object of the invention is to provide a semiconductor memory device capable of ensuring a minimum cycle time and setting a previous data hold time and an access time to an optimum.

Still another object of the invention is to provide an operating method in which a previous data hold time and an access time can be set to an optimum, ensuring a minimum cycle time at the same time in a serial access memory.

Yet another object of the invention is to make it possible to set a previous data hold time and an access time to an optimum, ensuring a minimum cycle time at the same time in a dual port memory.

The semiconductor memory device in accordance with the invention includes storing circuitry for storing a plurality of information, read circuitry for serially reading the information stored in the storing circuitry, first holding circuitry for holding the information read by the read circuitry, second holding circuitry for holding the information supplied from the first holding circuitry, first transfer circuitry for transferring the information read by the read circuitry to the first holding circuitry, second transfer circuitry for transferring the information from the first holding circuitry to the second holding circuitry, and output circuitry for externally supplying the information held in the second holding circuitry as output. The semiconductor memory device further includes control circuitry for effecting control so that an output operation by the output circuitry may be effected and then a transfer operation by the first transfer circuitry may be effected after the transfer operation by the second transfer circuitry has been effected.

In accordance with the semiconductor memory device, the information held in the second holding circuitry is externally supplied as output after the information to be outputted in the present cycle has been transferred from the first holding circuitry to the second holding circuitry. Therefore the information supplied in the previous cycle is held until the output operation of the output circuitry is effected even though the information is transferred from the first holding circuitry to the second holding circuitry immediately after the start of the read cycle. The next information read by the read circuitry can be transferred to the first holding circuitry immediately after the information is transferred from the first holding circuitry to the second holding circuitry.

Therefore, it becomes possible to set a previous data hold time and an access time to a suitable value without making the cycle time longer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
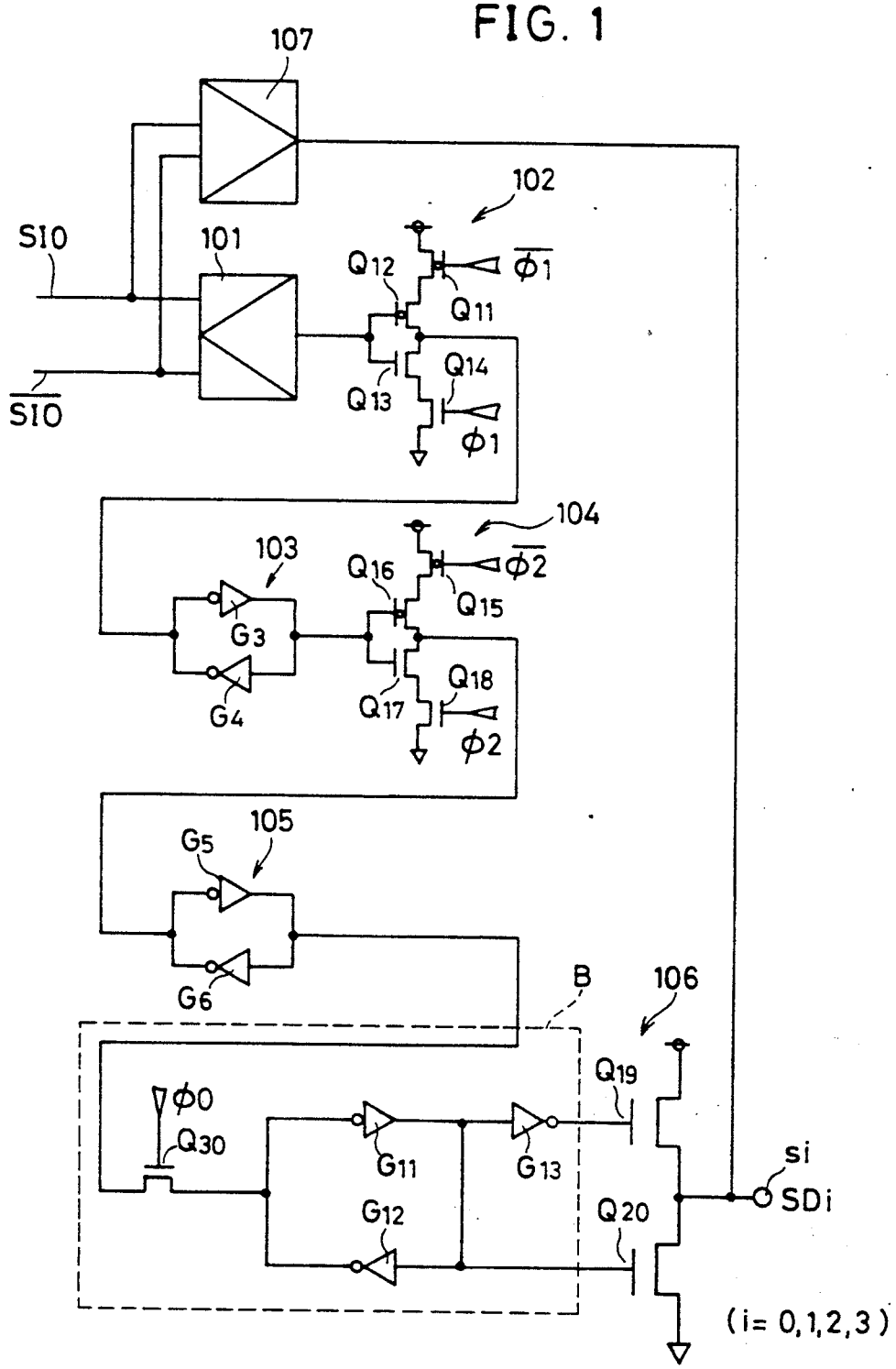
FIG. 1 is a circuit diagram showing the structure of an input-output circuit included in a dual port memory in accordance with one embodiment of the invention.

FIG. 1 shows the structure of an input-output circuit included in a dual port memory in accordance with one embodiment of the invention.

The input-output circuit in FIG. 1 includes amplifiers 101, 107, a first transfer circuit 102, a second transfer circuit 104, a first latch circuit 103, a second latch circuit 105, an output circuit 106 and a circuit portion B. The output circuit 106 and the circuit portion B constitute a main amplifier.

Figure 6:
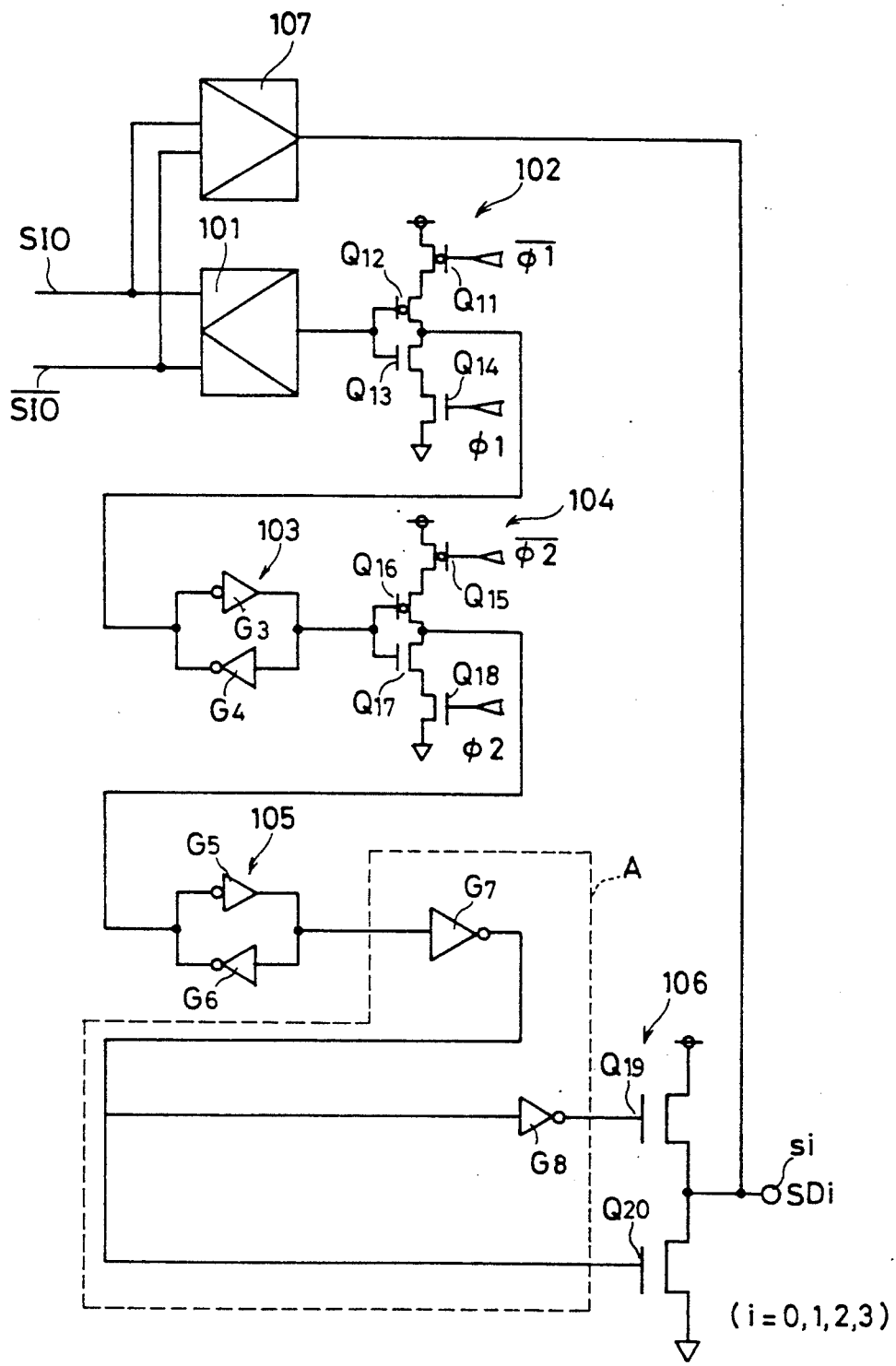
FIG. 6 is a circuit diagram showing the structure of an input-output circuit included in the dual port memory in FIG. 4.
Figure 7:
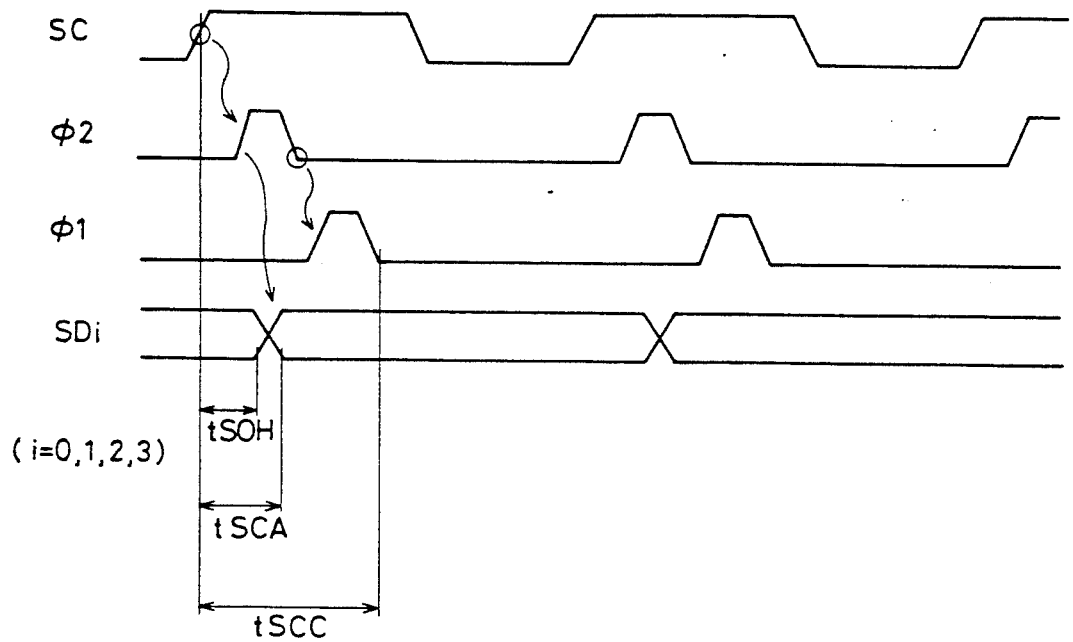
FIGS. 7 and 8 are waveform diagrams for describing the operation of the input-output circuit in FIG. 6.
Figure 8:
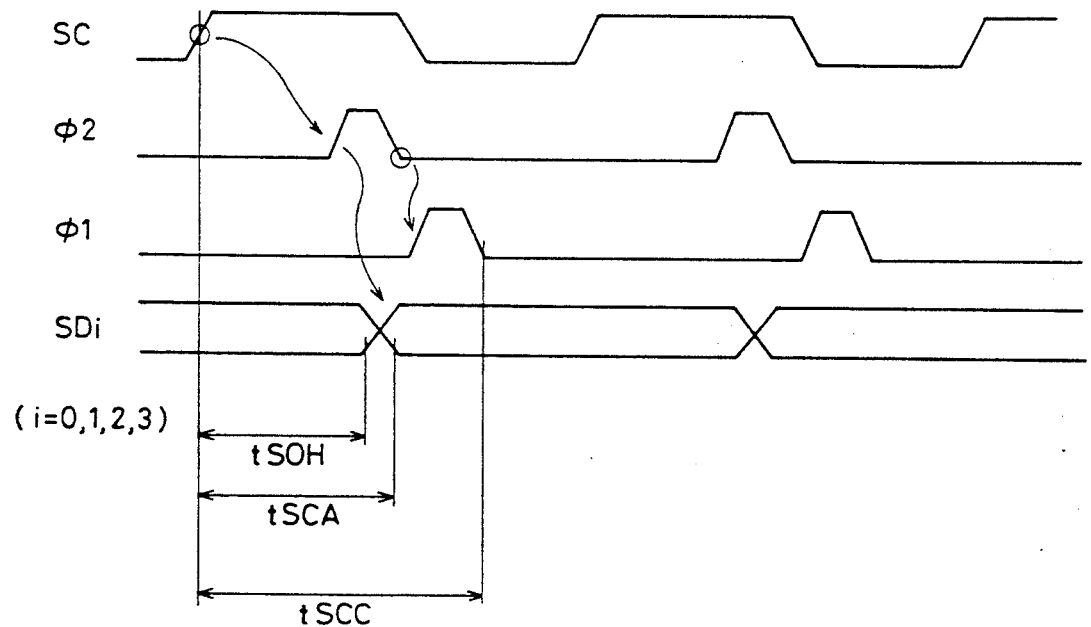

The structures of the amplifiers 101, 107, the first transfer circuit 102, the second transfer circuit 104, the first latch circuit 103, the second latch circuit 105 and the output circuit 106 are the same as the structures of those shown in FIG. 6. However, as will be described later, the timings of the transfer signals $\phi 1$, $\overline{\phi 1}$ and $\phi 2$, $\overline{\phi 2}$ are different from those in the input-output circuit of FIG. 6.

The circuit portion B includes an N channel MOS transistor Q30 and inverters G11–G13. The inverters G11, G12 constitute a latch circuit. The transistor Q30 is connected between a second latch circuit 105 and a latch circuit including the inverters G11, G12. A transfer signal $\phi 0$ is applied to the gate of the transistor Q30. The output of the latch circuit including the inverters G11, G12 is supplied to the gate of a transistor Q19 of an output circuit 106 through the inverter G13. The output of the latch circuit including the inverters G11, G12 is supplied to the gate of a transistor Q20 of the output circuit 106.

Figure 2:
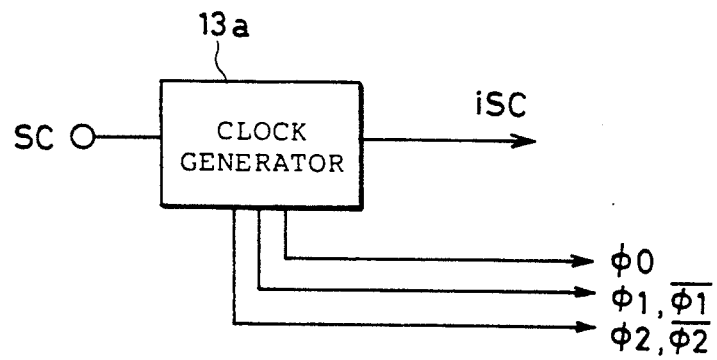
FIG. 2 is a diagram showing the structure of a clock generator used in the same embodiment.

Transfer signals $\phi 1$, $\overline{\phi 1}$, $\phi 2$, $\overline{\phi 2}$, $\phi 0$ are generated from a clock generator 13a shown in FIG. 2. The clock generator 13a generates an internal clock signal iSC and transfer signals $\phi 1$, $\overline{\phi 1}$, $\phi 2$, $\overline{\phi 2}$, $\phi 0$ in response to an external clock signal SC.

Figure 4:
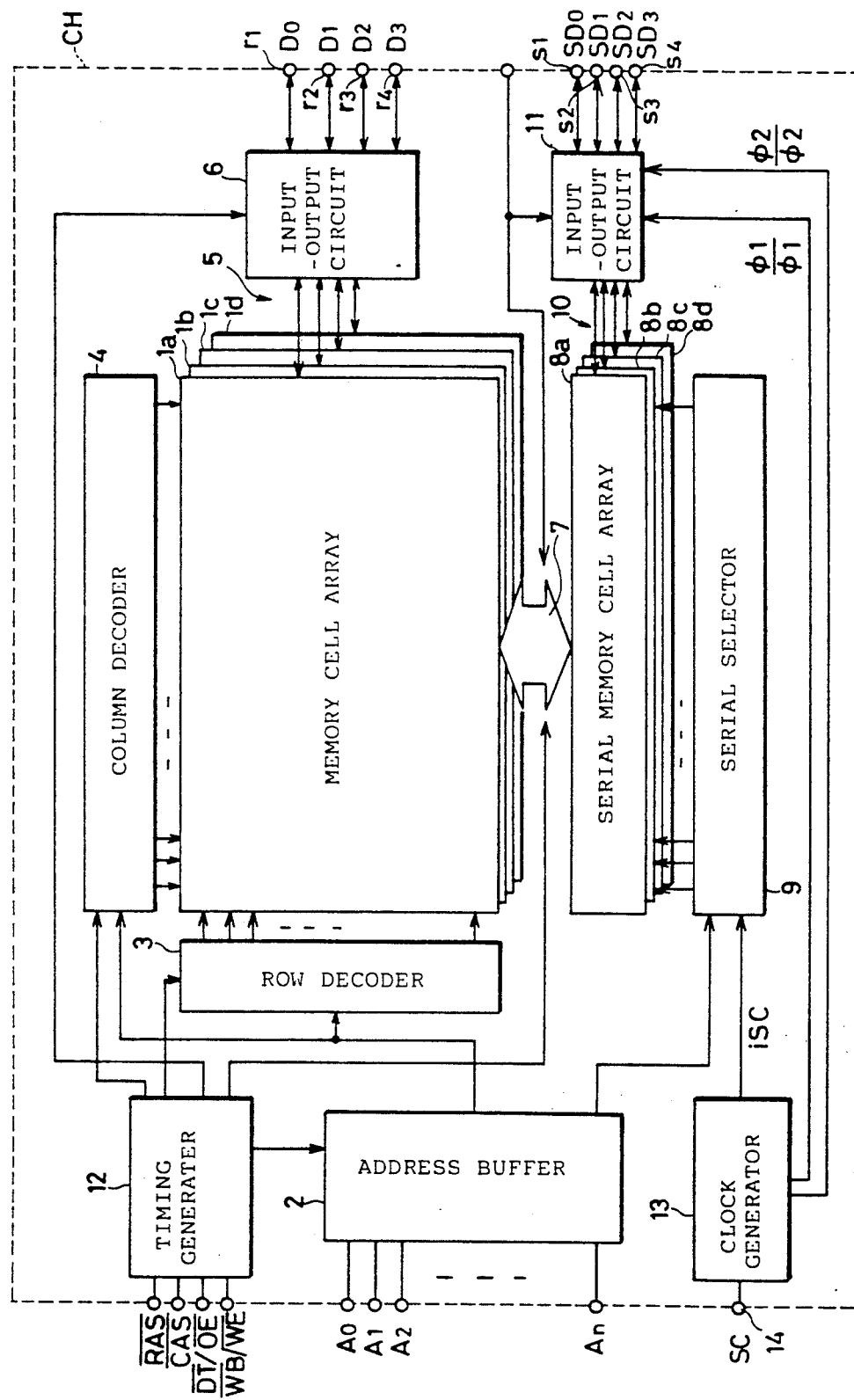
FIG. 4 is a block diagram showing one example of the structure of the dual port memory.
Figure 5:
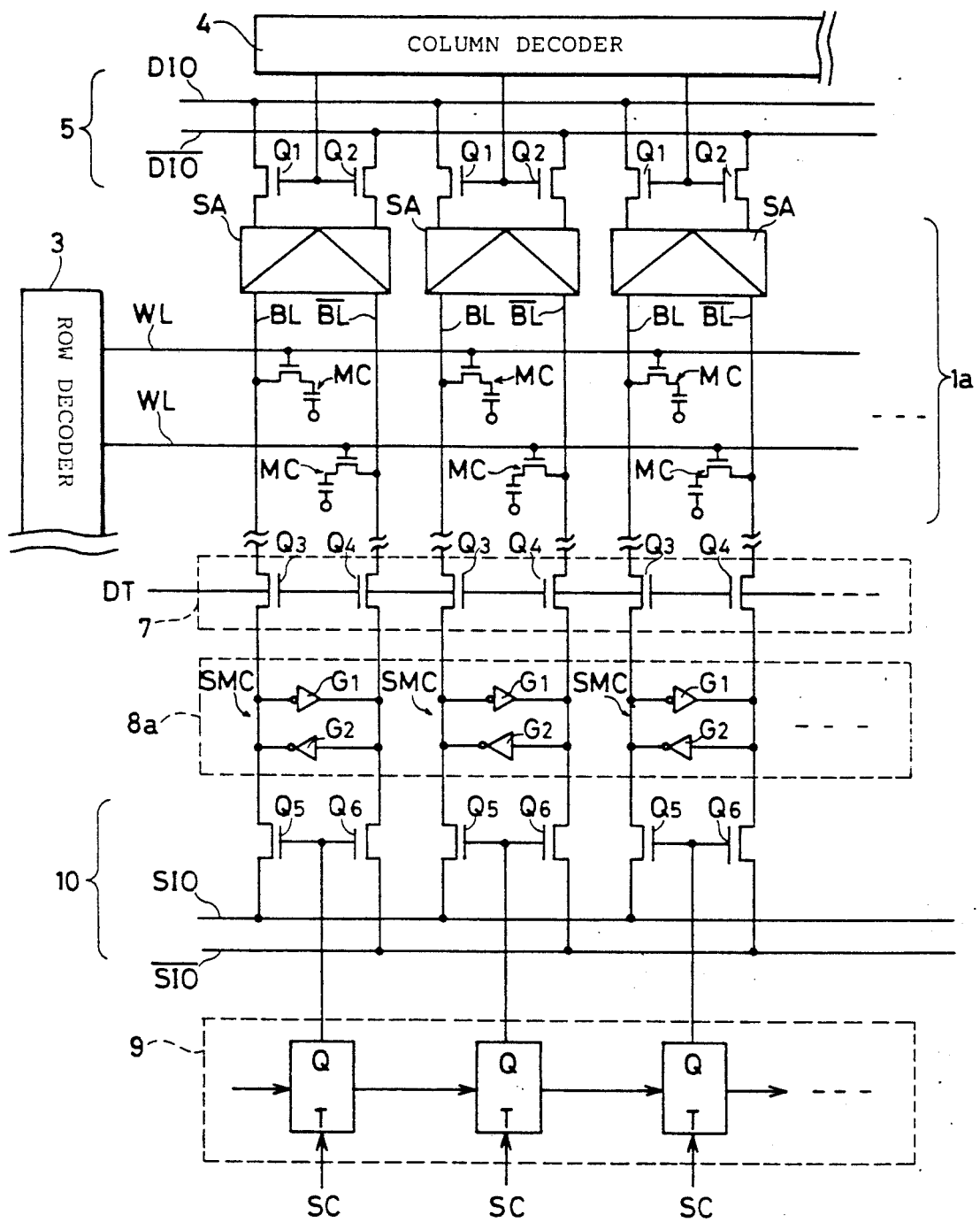
FIG. 5 is a circuit diagram for precisely showing the structure of the main portion of the dual port memory in FIG. 4.

The structures of other portions of the dual port memory in accordance with the embodiment is the same as the structures of those shown in FIG. 4.

Figure 3:
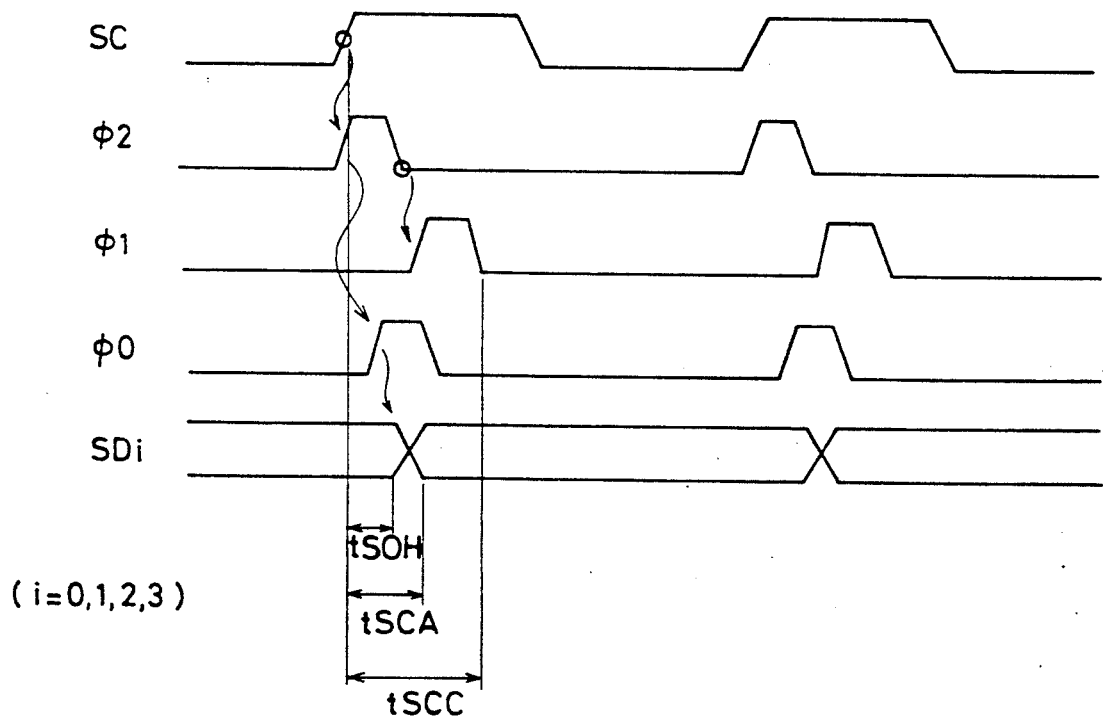
FIG. 3 is a waveform diagram for describing the operation of the input-output circuit in FIG. 1.

The operation of the input-output circuit in FIG. 1 will now be described referring to the waveform diagram in FIG. 3.

The data read from the n-th address in the serial memory cell arrays 8a–8d (FIG. 4) is held in the first latch circuit 103. After the external clock signal SC rises to an H level, the transfer signal $\phi 2$ immediately rises to an H level. The second transfer circuit 104 turns on, and the data held in the first latch circuit 103 is transferred to the second latch circuit 105. Then the transfer signal $\phi 0$ rises to an H level. The transistor Q30 turns on, so that the data held in the second latch circuit 105 is transferred to a latch circuit in the circuit portion B and supplied to a data input-output terminal si through the output circuit 106. In this case, the previous data hold time tSOH is determined by the transfer signal $\phi 0$. Therefore, the previous data hold time tSOH does not become shorter even if the transfer signal $\phi 2$ rises immediately after the rise of the external clock signal SC.

The transfer signal $\phi 1$ then rises to an H level after the transfer signal $\phi 2$ falls to an L level. As a result, the data read from the (n+1)-th address through data input-output line pair SIO, $\overline{SIO}$ and the amplifier 101 is transferred to the first latch circuit 103 in preparation for read operation of the next cycle.

In this case, the cycle time tSCC is determined at the time of the fall of the transfer signal $\phi 1$. The transfer signal $\phi 2$ rises immediately after the rise of the external clock signal SC, so that the falling timing of the transfer signal $\phi 1$ is made earlier and the cycle time tSCC is shortened.

When the external clock signal SC is supplied in the next cycle, the data in the (n+1)-th address is transferred from the first latch circuit 103 to the second latch circuit 105, and then the data read from the (n+2)-th address is transferred to the first latch circuit 103.

As stated above, the transfer signal $\phi 2$ can be brought to an active state almost at the same time of the input of the external clock signal SC, so that a minimum cycle time tSCC can be obtained.

It is possible to set a previous data hold time tSOH and an access time tSCA independently of the cycle time tSCC by using the transfer signal $\phi 0$. Accordingly, an optimum previous data hold time tSOH and an optimum access time tSCA can be obtained, ensuring a minimum cycle time tSCC at the same time.

While the present invention is applied to a dual port memory in the embodiment above, the invention can also be applied to a serial access memory having no random access memory.

As stated above, in accordance with the present invention, it is possible to set a previous data hold time and an access time to an optimum, ensuring a minimum cycle time at the same time. Therefore, a fast semiconductor memory device without malfunction can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   storing means for storing a plurality of information;
   read means for serially reading the information stored in said storing means;
   first holding means for holding the information read by said read means;
   second holding means for holding the information supplied from said first holding means;
   first transfer means for transferring the information read by said read means to said first holding means;
   second transfer means for transferring the information from said first holding means to said second holding means;
   output means for externally supplying as output the information held in said second holding means; and
   control means for effecting control so that after the transfer by said second transfer means has been effected, an output operation by said output means may be effected, and then the transfer by said first transfer means may be effected.

2. The semiconductor memory device according to claim 1, wherein said control means generates a second activation signal for activating said second transfer means, then a first activation signal for activating said output means, and then a third activation signal for activating said first transfer means.

3. The semiconductor memory device according to claim 2, wherein said first transfer means includes a first inverter circuit responsive to said first activation signal to become active, and
   said second transfer means includes a second inverter circuit responsive to said second activation signal to become active.

4. The semiconductor memory device according to claim 1, wherein said first holding means includes a latch circuit, and
   said second holding means includes a latch circuit.

5. The semiconductor memory device according to claim 1, wherein said output means comprises:
   third holding means for holding information;
   switch means connected between said second holding means and said third holding means, responsive to said third activation signal to become conductive; and
   output circuit for externally supplying as output the information held in said third holding means.

6. The semiconductor memory device according to claim 1, wherein said storing means includes a plurality of memory cells arranged in a column, and
   said read means includes serial selector means responsive to an externally applied address signal for sequentially selecting said plurality of memory cells.

7. A dual port memory, comprising:
   a first memory cell array including a plurality of memory cells arranged in a matrix;
   first selecting means for randomly selecting any of the plurality of memory cells in said first memory cell array for writing or reading of information;
   first input-output means for supplying externally applied information to said first memory cell array or externally supplying as output the information read from said first memory cell array;
   a second memory cell array including a plurality of memory cells arranged in a row;
   second selecting means for sequentially selecting the plurality of memory cells in said second memory cell array for writing or reading of information;
   second input-output means for supplying externally applied information to said second memory cell array or externally supplying as output the information read from said second memory cell array;
   transfer means for transferring the information between one row in said first memory cell array and said second memory cell array; and
   control means for controlling said second input-output means,
   said second input-output means including:
      first holding means for holding the information read form said second memory cell array;
      second holding means for holding the information supplied from said first holding means;
      first transfer means for transferring the information read from said second memory cell array to said first holding means;
      second transfer means for transferring the information from said first holding means to said second holding means;
      output means for externally supplying as output the information held in said second holding means; and
      said control means for effecting control so that after the transfer by said second transfer means has been effected, the output operation by said output means may be effected, and then the transfer by said first transfer means may be effected.

8. The dual port memory according to claim 7, wherein said first selecting means comprises:
   row selecting means for selecting any of the plurality of rows in said first memory cell array for writing or reading of information; and
   column selecting means for selecting any of the plurality of columns in said first memory cell array for writing or reading of information.

9. The dual port memory according to claim 7, wherein each of the plurality of memory cells in said first memory cell array includes a dynamic type memory cell, and
   each of the plurality of memory cells in said second memory cell array includes a static type memory cell.

10. The dual port memory according to claim 7, wherein said control means controls said second input-output means in response to an externally applied clock signal.

11. An operating method of a semiconductor memory device comprising storing means for storing a plurality of information and first and second holding means for holding information, comprising the steps of:
    serially reading the information stored in said storing means;
    transferring the information from said first holding means to said second holding means,
    then externally supplying as output the information held in said second holding means; and then
    transferring the information read from said storing means to said first holding means.

* * * * *